United States Patent
Kerr et al.

(10) Patent No.: US 9,240,770 B2
(45) Date of Patent: Jan. 19, 2016

(54) HARMONIC CANCELLATION CIRCUIT FOR AN RF SWITCH BRANCH

(71) Applicant: RF Micro Devices, Inc., Greensboro, NC (US)

(72) Inventors: Daniel Charles Kerr, Oak Ridge, NC (US); Eric K. Bolton, Kernersville, NC (US); Robert Andrew Phelps, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 126 days.

(21) Appl. No.: 14/212,831

(22) Filed: Mar. 14, 2014

(65) Prior Publication Data

US 2014/0266415 A1  Sep. 18, 2014

Related U.S. Application Data

(60) Provisional application No. 61/789,422, filed on Mar. 15, 2013.

(51) Int. Cl.
*H03K 17/687* (2006.01)
*H03H 11/12* (2006.01)
*H03K 17/693* (2006.01)
*H01P 1/15* (2006.01)
*H03K 17/10* (2006.01)

(52) U.S. Cl.
CPC ......... *H03H 11/1213* (2013.01); *H03K 17/693* (2013.01); *H01P 1/15* (2013.01); *H03K 17/102* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 7,492,209 B2* | 2/2009 | Prikhodko | ............... | H01P 1/15 327/384 |
| 8,461,903 B1* | 6/2013 | Granger-Jones | ....... | H03K 17/04 327/427 |
| 8,786,002 B2* | 7/2014 | Kondo | ..................... | H04B 1/48 257/296 |
| 8,922,268 B2* | 12/2014 | Madan | ................. | H03K 17/162 327/427 |
| 2008/0079514 A1* | 4/2008 | Prikhodko | ........... | H03H 7/0115 333/175 |
| 2008/0290928 A1* | 11/2008 | Kawakyu | ............. | H03K 17/005 327/429 |
| 2009/0206910 A1* | 8/2009 | Takahashi | ............ | H03K 17/063 327/427 |
| 2010/0069020 A1* | 3/2010 | Koya | ...................... | H04B 1/006 455/78 |
| 2010/0225377 A1* | 9/2010 | Okashita | .............. | H03K 17/063 327/427 |
| 2011/0133816 A1* | 6/2011 | Wu | ....................... | H03K 17/164 327/434 |
| 2011/0260774 A1* | 10/2011 | Granger-Jones | ..... | H03K 17/102 327/427 |
| 2014/0062575 A1* | 3/2014 | Hurwitz | ............... | H03K 17/161 327/379 |
| 2014/0335801 A1* | 11/2014 | Bolton | ................... | H04B 15/02 455/83 |

* cited by examiner

*Primary Examiner* — Tuan T Lam
(74) *Attorney, Agent, or Firm* — Withrow & Terranova, P.L.L.C.

(57) ABSTRACT

Disclosed is a harmonic cancellation circuit for an RF switch branch having a first transistor with a first gate terminal and a first body terminal, a second transistor having a second gate terminal coupled to the first body terminal, and having a second body terminal coupled to the first gate terminal. Also included is a first resistor coupled between a first coupling node and the second body terminal, and a second resistor coupled between a second coupling node and the first body terminal, wherein the first transistor and second transistor are adapted to generate an inverse phase third harmonic signal relative to a third harmonic signal generated by the RF switch branch, such that the inverse phase third harmonic signal is output through the first resistor and the second resistor to the RF switch branch to reduce the third harmonic signal.

24 Claims, 8 Drawing Sheets

HARMONIC CANCELLATION CIRCUIT FOR AN RF SWITCH BRANCH

RELATED APPLICATIONS

This application claims the benefit of U.S. provisional patent application No. 61/789,422, filed Mar. 15, 2013, the disclosure of which is incorporated herein by reference in its entirety.

FIELD OF THE DISCLOSURE

The present disclosure relates to suppressing third harmonic (H3) signals generated by electronic devices used in wireless communication products such as mobile terminals.

BACKGROUND OF THE DISCLOSURE

Demands for cellular downlink data are rapidly increasing as consumers use greater numbers of data intensive applications on their wireless data devices. This trend is encouraging wireless carriers and wireless service providers to explore new ways of increasing downlink data rates. One known method for increasing downlink data rates employs receive carrier aggregation. Receive carrier aggregation allows a wireless device to simultaneously receive data using multiple downlink frequency bands to improve throughput while simultaneously transmitting on another band. Receive carrier aggregation may be either contiguous or non-contiguous. In the case of non-contiguous carrier aggregation, receive carrier aggregation may be applied either intra-band or inter-band. The present disclosure relates to non-contiguous inter-band operation where a second receive band is located at a third harmonic (H3) of a transmit frequency.

In non-contiguous inter-band operation where one of the receive bands is located at the H3 of the transmit frequency, the harmonics generated in a power amplifier (PA) and front end (FE) switches are not attenuated sufficiently enough to prevent receiver desensitization. Related art methods for reducing receiver desensitization due to harmonics include improving a lower band duplex filter attenuation of the third harmonic of the TX frequency, improving the diplexer low band/high band (LB/HB) isolation, and adding continuously active (i.e., static) notch filters into the TX path, and the implementation of dual feed antennas with inherent LB/HB isolation.

However, these related art methods such as adding static notch filters into the TX path may not be directly applicable to antenna tuning components. For example, an antenna can be tuned by changing the impedance of the ground connection of the antenna. An RF switch is commonly used to switch this impedance. The location of the RF switch relative to the antenna may make it difficult or impossible to implement diplexers, lowpass filters, notch filters, etc. A better approach is to eliminate the need for filtering by reducing the amount of H3 produced by switch branches making up FE switches. Therefore, a need remains to reduce the H3 in components making up the FE switches in order to attenuate the generated H3.

SUMMARY

A harmonic cancellation circuit for an RF switch branch is disclosed. The harmonic cancellation circuit for an RF switch branch includes a first transistor with a first gate terminal and a first body terminal, a second transistor having a second gate terminal coupled to the first body terminal, and having a second body terminal coupled to the first gate terminal. Also included is a first resistor coupled between a first coupling node and the second body terminal, and a second resistor coupled between a second coupling node and the first body terminal, wherein the first transistor and second transistor are adapted to generate an inverse phase third harmonic signal relative to a third harmonic signal generated by the RF switch branch, such that the inverse phase third harmonic signal is output through the first resistor and second resistor to the RF switch branch to reduce the third harmonic signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figures 1A, 1B:
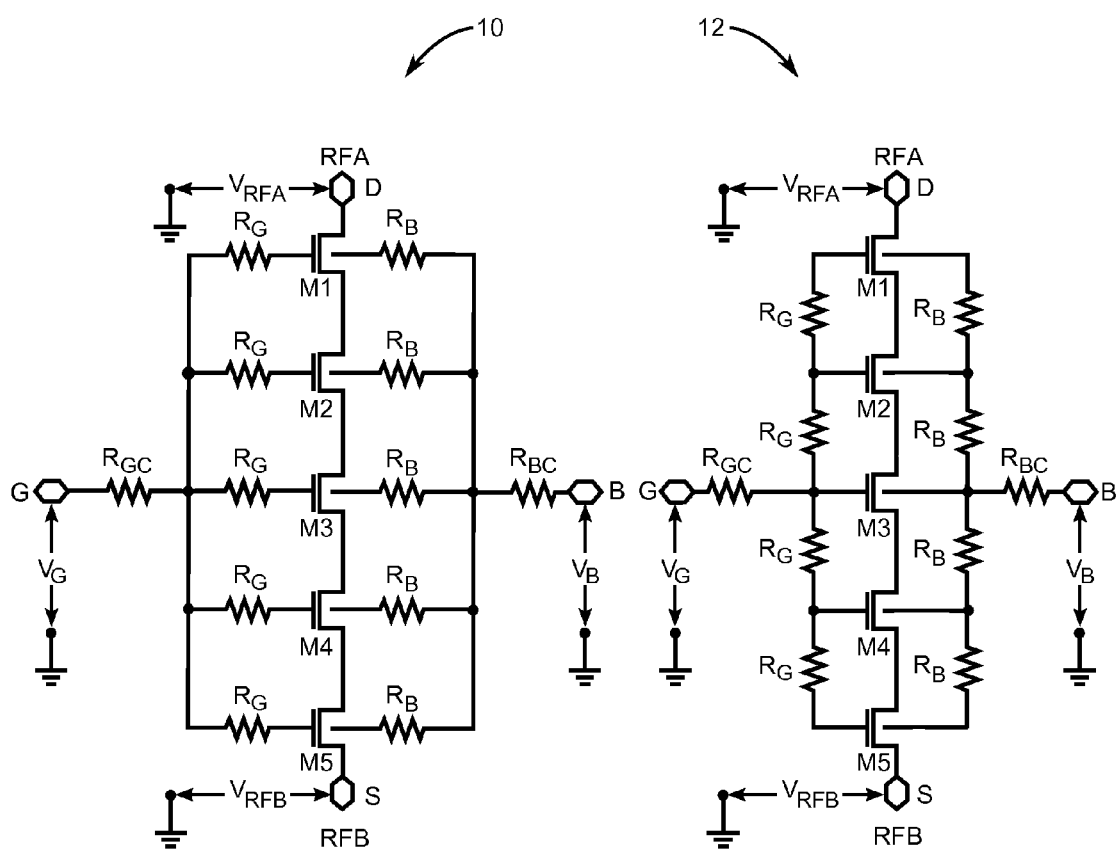
FIG. 1A is a schematic diagram depicting a prior art RF switch branch made up of a stack of parallel biased field effect transistors (FETs).
FIG. 1B is a schematic diagram depicting a prior art RF switch branch made up of a stack of series biased FETs.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims. Throughout the drawing figures, components such as resistors having identical labels/element numbers have substantially identical values.

Off-state switches are slightly nonlinear and produce harmonics. Circuits of the present disclosure add other harmonic generators such that a set of combined harmonics cancel out. The present disclosure provides circuits having structures designed to provide third harmonic (H3) generation that cancels third harmonics generated by off-state switch branches. The presently disclosed circuits are directed to body-contacted switch branches.

FIG. 1A is a schematic depicting a prior art RF switch branch 10 having a parallel bias scheme, whereas FIG. 1B is a schematic depicting a prior art RF switch branch 12 having a series bias scheme. Both RF switch branch 10 and RF switch branch 12 are constructed using a series stack of NFETs M1-M5, with resistors $R_G$, $R_B$, $R_{GC}$, and $R_{BC}$ setting a bias point for either an on-state or off-state operation. However, the present disclosure is specific to off-state cancellation of an H3 generated by RF switch branches such as RF switch branch 10 and RF switch branch 12. For example, the RF switch branch 10 can be put into an off-state by applying a gate voltage $V_G$ that is equal to a body voltage $V_B$, and lower than the voltages at a first port RFA and a second port RFB. Moreover, if a voltage $V_{RFA}$ at the first port RFA and a voltage $V_{RFB}$ at the second port RFB are set to 0 V, and the gate voltage $V_G$ and the body voltage $V_B$ are set to −2.5V, the RF switch branch 12 will be turned off. In a second example, which may be capacitor blocked, the RF switch branch 12 can be turned off by setting the voltage $V_{RFA}$ at the first port RFA and a voltage $V_{RFB}$ at the second port RFB are set to +2.5V, and the gate voltage $V_G$ and the body voltage $V_B$ are set to 0 V.

Each field effect transistor (FET) in a stack of FETs making up either RF switch branch 10 or RF switch branch 12 that is in the off-state has an approximately equal part of a total RF voltage across the FET, and each FET acts as a nonlinear harmonic generator. In one case, source S and drain D terminals are at 0 V, and gate G and base B terminals are biased to a negative voltage. The RF voltage occurs across the source S terminals and drain D terminals.

A basic circuit which generates a cancelling harmonic also uses one or more FET(s) and resistor(s). The FET and resistor technology can be the same FET and resistor technology used to construct the RF switch branch 10 and the RF switch branch 12. A capacitance for each FET is relatively small, and nearly constant with voltage. However, there is a slight voltage dependent capacitance that urges a FET to generate harmonics. An exemplary change in capacitance measured for FETs typically used to implement the harmonic cancellation of the present disclosure is less than 1%. A simple model of an off-state FET nonlinearity is calculable using a polynomial fit equation:

$$C(V)=C0+V*C1+V*V*C2 \quad (1)$$

The voltage V in this case is the source-drain voltage. The nonlinearity responsible for generating a third harmonic is coefficient C2 of equation 1 above. The constant C0 portion is typically around 960 fF, and the nonlinear C2 has a value on the order of around 2.3 fF/V$^2$ Therefore, with V equal to 1 V, the nonlinear/linear portion is 2.3/960=0.24%. However, a change of total capacitance for a first transistor and a second transistor making up a harmonic cancellation circuit ranges from around about 0.1% to around about 1%. Moreover, the nonlinear capacitance C2 value ranges from around about 1 fF/V$^2$ to around about 3 fF/V$^2$.

Figures 2A, 2B, 2C:
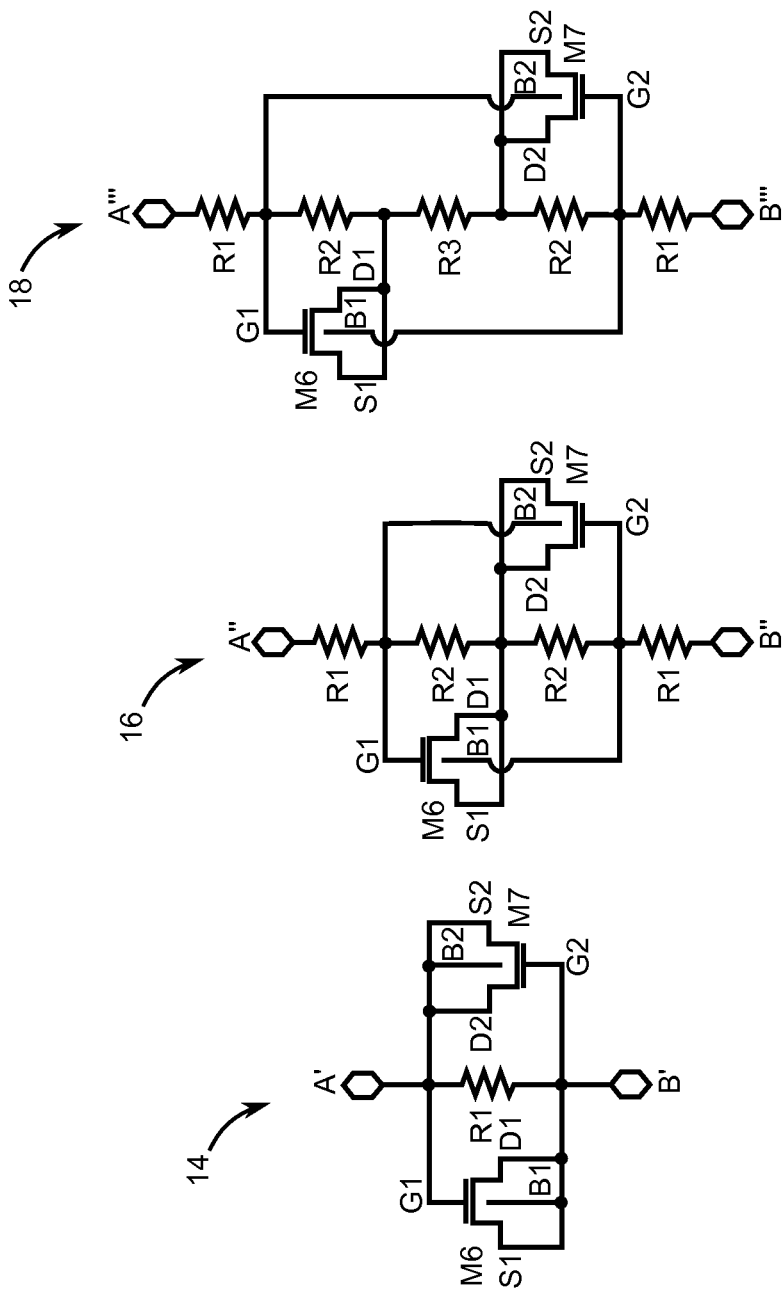
FIG. 2A is a schematic diagram depicting a related art harmonic cancellation circuit.
FIG. 2B is a schematic diagram depicting an embodiment of an improved harmonic cancellation circuit.
FIG. 2C is a schematic diagram depicting an embodiment of a further improved harmonic cancellation circuit.

FIGS. 2A, 2B, and 2C are schematics depicting three harmonic cancellation circuit variants that generate inverse phase H3 signals that are usable to cancel or at least reduce H3 signals generated by an RF switch branch such as RF switch branch 10 (FIG. 1A) or RF switch branch 12 (FIG. 1B). Each circuit depicted in FIGS. 2A, 2B, and 2C have practically identical parameters and a symmetrical die layout. Moreover, resistors with the same element numbers/labels have practically identical values.

In particular, FIG. 2A depicts a related art harmonic cancellation circuit 14 that is constructed with a first transistor M6 and a relatively identical second transistor M7 along with a first resistor R1 coupled between a first gate G1 and a second gate G2. The first transistor M6 and the second transistor M7 are each a field effect transistor (FET) type. The related art harmonic cancellation circuit 14 has a first coupling node A' and a second coupling node B' for coupling to additional harmonic cancellation circuits and for coupling to an RF switch branch for which H3 is to be cancelled. The voltages between source terminals S1 and S2, drain terminals D1 and D2, and body terminals B1 and B2 are equal. The first transistor M6 and the second transistor M7 are placed on a die (not shown) with symmetry so that there is no impact from second harmonic generation. The related art harmonic cancellation circuit 14 will produce out-of-phase third harmonics as long as the gate to source voltage for the FET does not exceed a threshold voltage VT.

FIG. 2B is a schematic diagram depicting an embodiment of an improved harmonic cancellation circuit 16 that is in accordance with the present disclosure. In this case, a source-body voltage is not zero. A gate to source voltage $V_{GS}$ for the improved harmonic cancellation circuit 16 is reduced by more than one half if the voltage between the gate G1 and the gate G2 is the same as the voltage between the first coupling node A' and the second coupling node B' of the related art harmonic cancellation circuit 14. Further still, the body-source bias changes the threshold voltage of the first transistor M6 and the second transistor M7, making it higher. In this way, neither the first transistor M6 nor the second transistor M7 reach their threshold voltage VT until a higher voltage across the first coupling node A" and the second coupling node B" is reached. FIG. 2C depicts a further improved embodiment, wherein the gate-source and source-body voltages can be tuned to provide more freedom, in particular, the voltage needed across a first coupling node A''' and a second coupling node B''' to reach a state wherein the gate to source voltage $V_{GS}$ equals the threshold voltage VT is even higher.

Figures 3A, 3B:
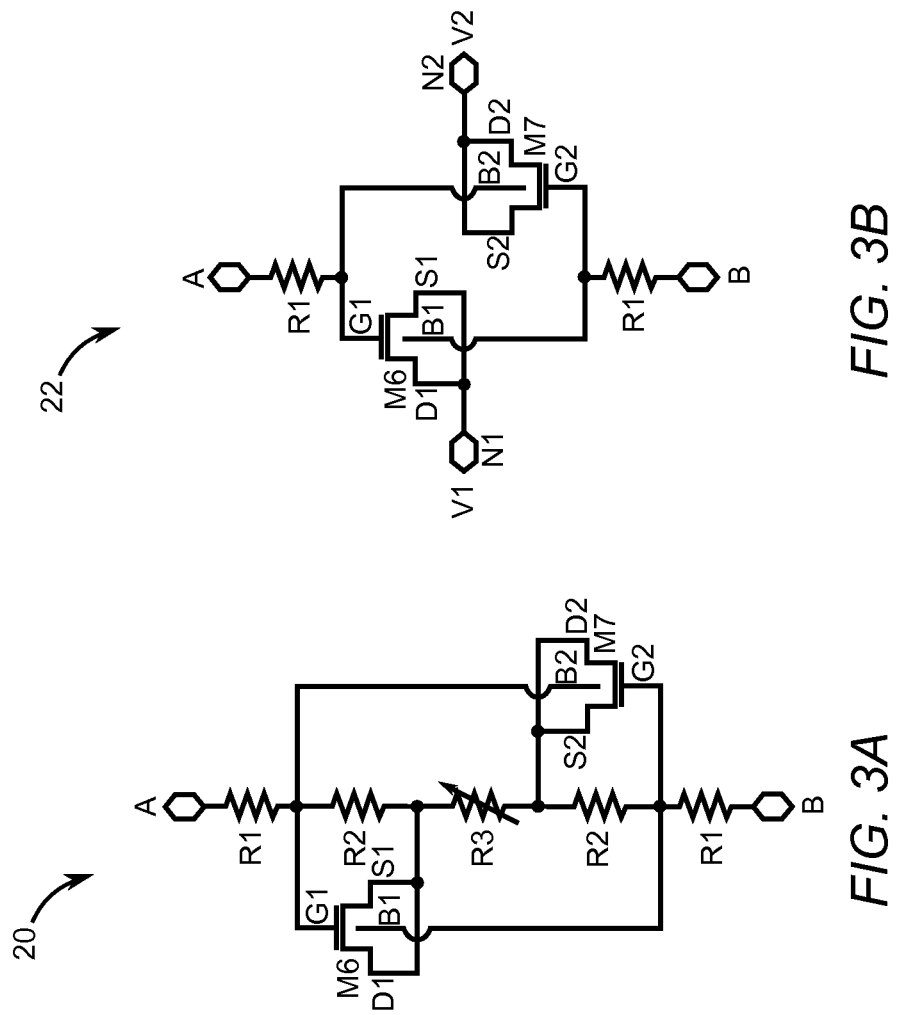
FIG. 3A is a schematic diagram depicting the embodiment of the harmonic cancellation circuit of FIG. 2C that is further improved by an addition of at least one resistor with controllable resistance.
FIG. 3B is a schematic diagram depicting an embodiment of a harmonic cancellation circuit configured for external biasing circuitry.

The harmonic cancellation circuits shown in FIGS. 2B-3B can be further tuned by an application of a control voltage, as shown in FIGS. 3A and 3B. For example, the resistors R1-R3 of the improved harmonic cancellation circuit 18 could be adjusted in value by replacing one or more of resistors R1-R3 with analog or digitally adjustable resistors, which are typically made up of a combination of resistors and FETs as known in the art. In this way, a resistance value of a resistor such as resistor R3 is made adjustable as shown in FIG. 3A. Resistance values for R1 range between around about 80 ohms to around about 1000 ohms, whereas R2 resistance values range between around about 480 ohms to 2000 ohms. Resistance values for R3 range from around about 80 ohms to around about 2000 ohms.

Another method of tuning the circuit, as shown in FIG. 3B is to disconnect the source and drain of each of the first transistor M6 and the second transistor M7 from a resistor bias string made up of the resistors R1-R3, and connect the source and drain of each of the first transistor M6 and the second transistor M7 to bias inputs N1 and N2 for receiving biasing voltages V1 and V2, respectively. In this way, a position of a notch at which a maximum H3 cancellation occurs can be adjusted for input power, frequency, and temperature, etc. Preferably, the input biases to V1 and V2 should be made through bias resistors, which can be implemented with the series bias scheme shown in FIG. 1B.

Figure 4A:
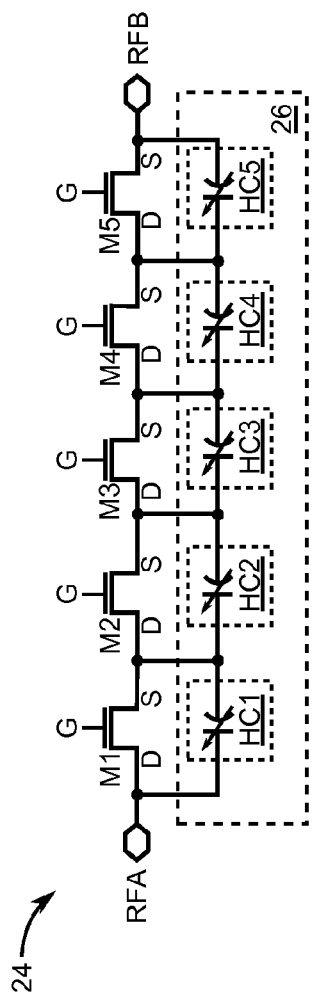
FIG. 4A is a schematic diagram depicting a first embodiment of an RF switch branch that incorporates a plurality of series coupled harmonic cancellation circuits coupled across a corresponding one of a plurality of series coupled transistor switches making up the RF switch branch.
Figure 4B:
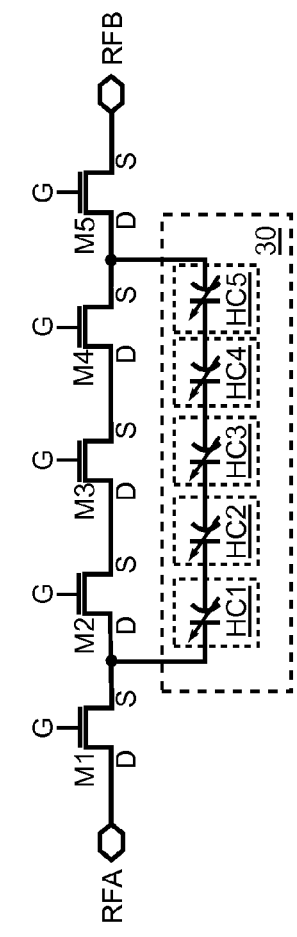
FIG. 4B is a schematic diagram depicting a second embodiment of the RF switch branch that incorporates the plurality of series coupled harmonic cancellation circuits that are coupled across only a portion of the plurality of series coupled transistor switches excluding ones of the plurality of series coupled transistor switches adjacent to a first port and a second port of the RF switch branch.
Figure 4C:
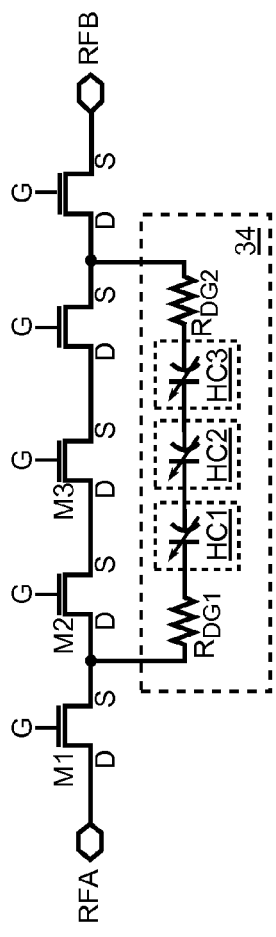
FIG. 4C is a schematic diagram depicting a third embodiment of the RF switch branch having degeneration resistors coupled between the plurality of series coupled harmonic cancellation circuits and the plurality of series coupled transistor switches.

FIGS. 4A, 4B, and 4C are schematics that depict several structures for RF switch branches having harmonic cancellation circuits. In FIGS. 4A, 4B, and 4C, harmonic cancellation circuits such as the disclosed improved harmonic cancellation circuits 16 (FIG. 2B), 18 (FIG. 2C), 20 (FIG. 3A), and 22 (FIG. 3B) are represented by varactor symbols HC1-HC5. The gate bias resistors $R_G$ and body bias resistors $R_B$ are omitted for clarity. In FIG. 4A, the same voltage that causes an RF switch branch 24 to generate an H3 signal is coupled to a harmonic cancellation block 26 made up of a plurality of series coupled harmonic cancellation circuits HC1-HC5. Each of the plurality of series coupled harmonic cancellation circuits HC1-HC5 are coupled across a corresponding one of plurality of series coupled transistor switches M1-M5 making up the RF switch branch 24. An advantage of the configuration for the RF switch branch 24 is immunity to voltage stacking non-uniformity. Other combinations can also be used, such as two harmonic cancellation blocks per each transistor switch making up the RF switch branch 24, etc.

In FIG. 4B, an RF switch branch 28 includes a harmonic cancellation block 30 that is connected at two nodes within the RF switch branch 28. In particular, the plurality of series coupled harmonic cancellation circuits HC1-HC5 are coupled across only a portion of the plurality of series coupled transistor switches M1-M5 excluding ones of the plurality of series coupled transistor switches M1-M5 adjacent to a first port RFA and a second port RFB, which in this case excludes transistor switch M1 and transistor switch M5, respectively. FIG. 4C maintains the overall structure of RF switch branch 28 (FIG. 4B) in an RF switch branch 32 while also including degeneration resistors $R_{DG1}$ and $R_{DG2}$ in a harmonic cancellation block 34 to increase linearity of the RF switch branch 32. Resistance values for degeneration resistors $R_{DG1}$ and $R_{DG2}$ range from around about 100 ohms to around about 10,000 ohms.

Figure 5:
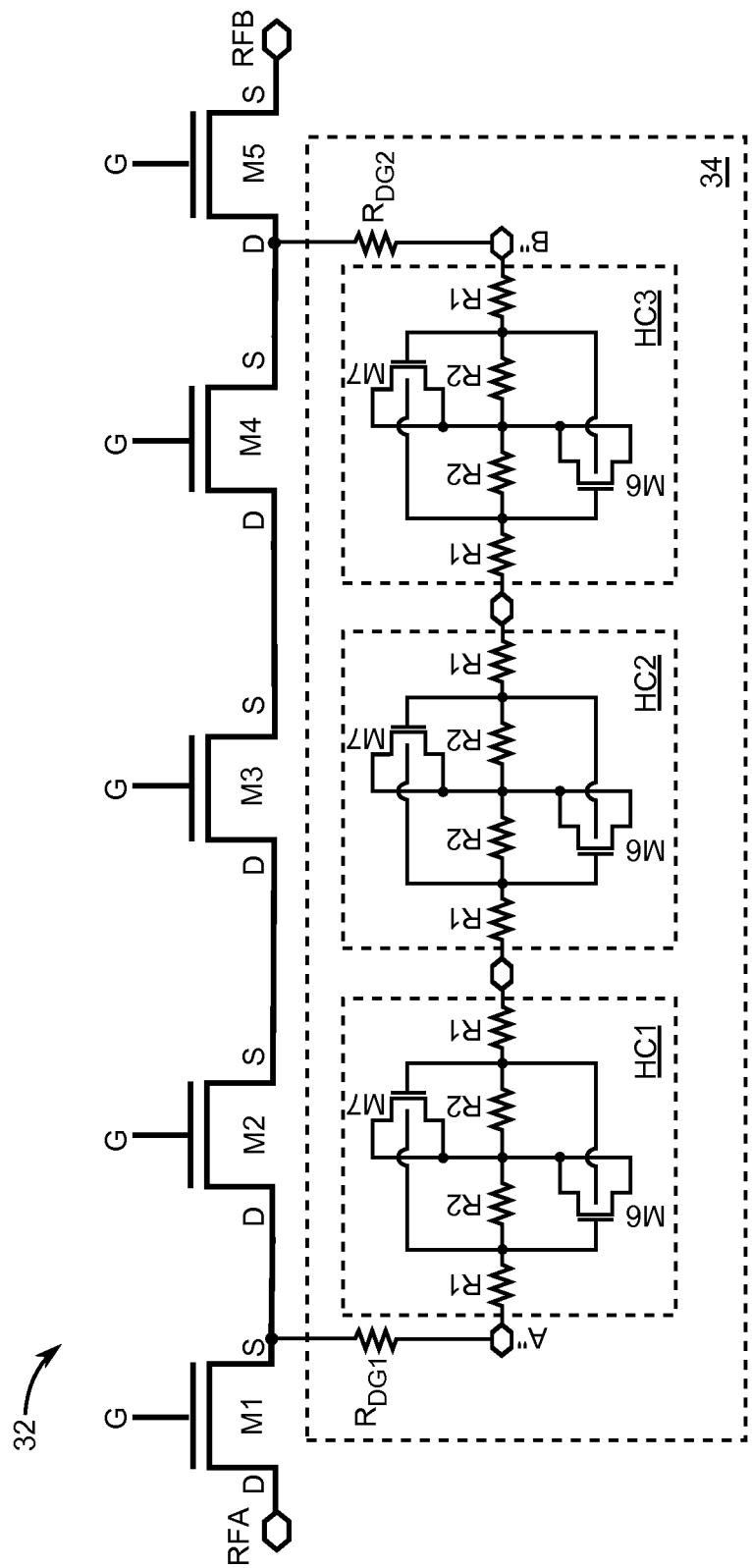
FIG. 5 is a schematic diagram depicting the RF switch branch depicted in FIG. 4C implemented using harmonic cancellation circuits based upon the harmonic cancellation circuit of FIG. 2B.

FIG. 5 is a schematic diagram depicting the RF switch branch 32 depicted in FIG. 4C implemented using harmonic cancellation circuits based upon the improved harmonic cancellation circuit 16 (FIG. 2B). Each harmonic cancellation circuit HC1-HC3 is made up of the harmonic cancellation circuit 16. However, it is to be understood that any of the other harmonic cancellation circuits such as improved harmonic cancellation circuit 18 (FIG. 2C), harmonic cancellation circuit 20 (FIG. 3A), and harmonic cancellation circuit 22 (FIG. 3B) can be used to make up any of the harmonic cancellation circuits HC1-HC5 for the RF switch branch 24 (FIG. 4A), the RF switch branch 28 (FIG. 4B) and the RF switch branch 32 (FIG. 4C).

Figure 6:
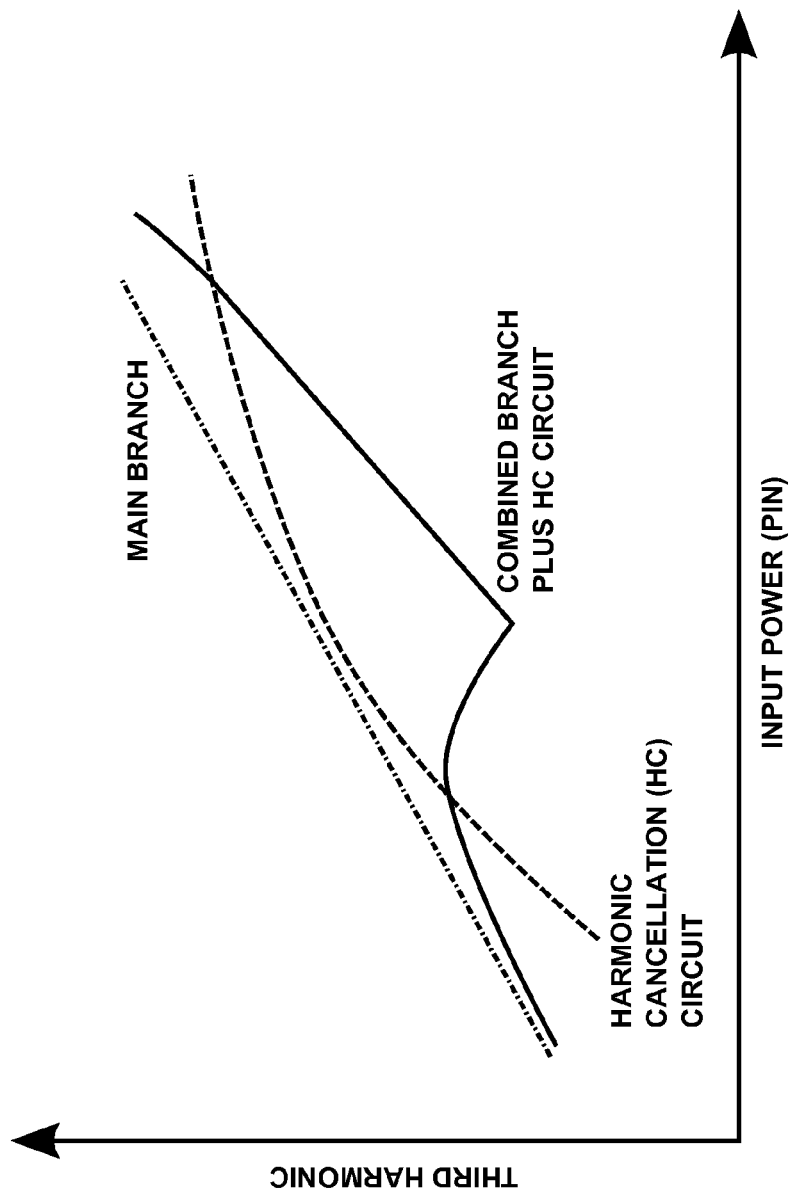
FIG. 6 is a graph depicting a third harmonic generated by an off-state RF switch branch combined with an inverse phase third harmonic generated by a harmonic cancellation circuit.

FIG. 6 is a graph showing third harmonic production versus input power that results from the RF switch branch 24 (FIG. 4A) coupled with the harmonic cancellation circuit 22 (FIG. 3B). In this exemplary case, a magnitude of an H3 signal (shown in dotted and dashed line) generated by the plurality of series coupled transistor switches M1-M5 making up the RF switch branch 24 and an inverse phase H3 signal (shown in dashed line) generated by the harmonic cancellation circuit 22 combine to produce a reduced H3 signal (shown in solid line). In essence, the RF switch branch 24 produces an undesirable H3 signal that is closely matched by an inverse H3 signal generated by the harmonic cancellation circuit 22 over a desired input power (PIN) range. Resistances and transistor parameters for the harmonic cancellation circuit 22 are adjusted such that the harmonics of the harmonic cancellation circuit 22 are close to the harmonics generated by the plurality of series coupled transistor switches M1-M5 making up the RF switch branch 24 over a predetermined critical range of input voltages and/or input powers. Since the harmonic cancellation circuit 22 produces an H3 signal that is out of phase with the H3 signal generated by the plurality of series coupled transistor switches M1-M5 making up the RF switch branch 24, a resultant H3 signal output to an RF system (not shown) associated with RF switch branch 24 is reduced.

Figure 7:
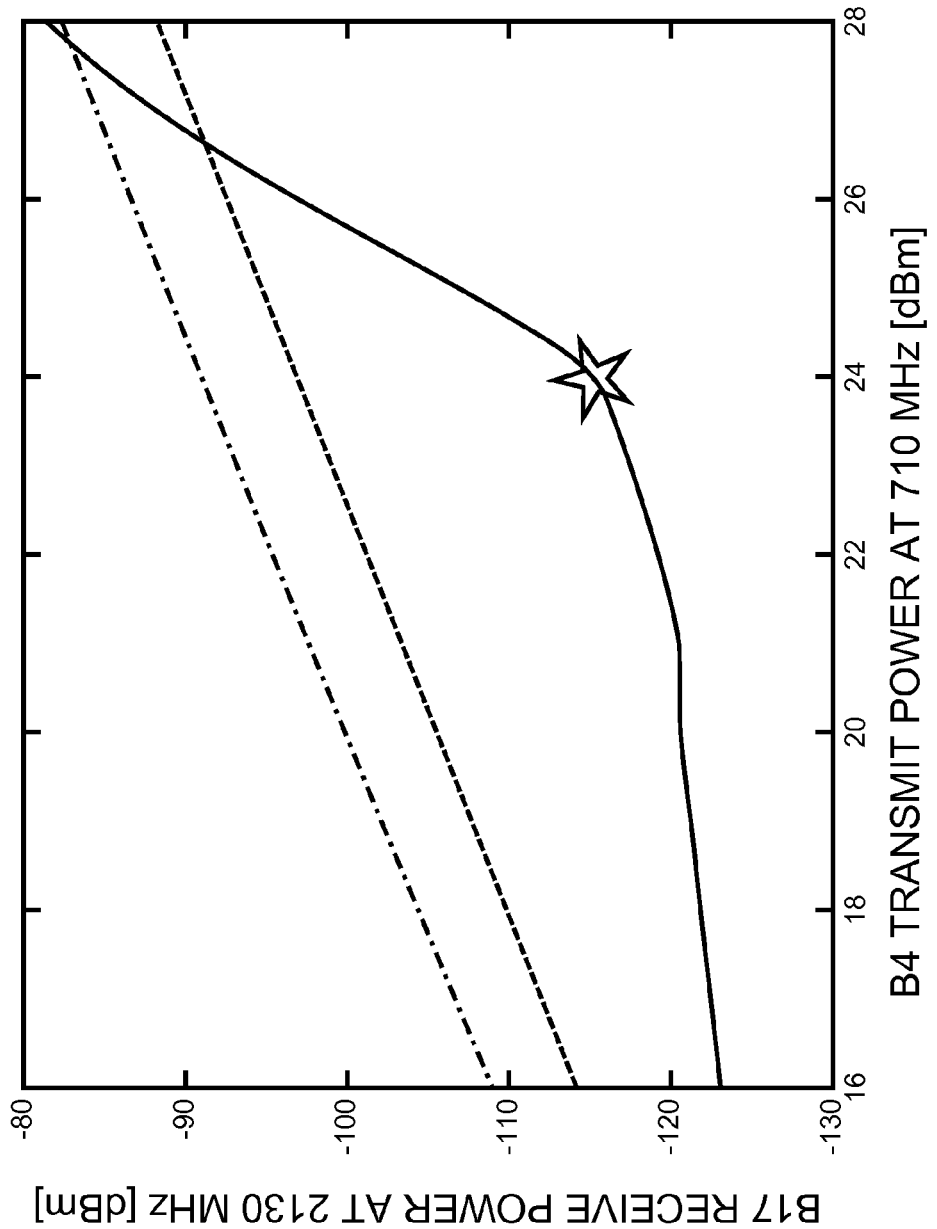
FIG. 7 is a graph depicting receiver power measured in dBm for a signal transmitted in band 17 (B17) versus band 4 (B4) input power as predicted by a simulation of the RF switch branch depicted in FIG. 4A.

FIG. 7 is a graph depicting receiver power measured in dBm for a signal transmitted in band 17 (B17) versus band 4 (B4) input power as predicted by a simulation of the RF switch branch 24 depicted in FIG. 4A. A dotted and dashed straight line represents an H3 signal level for a relatively large RF switch branch and a dashed only straight line represents an H3 signal generated by a relatively smaller RF switch branch during operation of a band 17 (B17) transmit signal at a frequency of 710 MHz. These levels of H3 signal would degrade receiver sensitivity in an associated radio receiver in B4 (not shown). A relatively large reduction in H3 signal over an RF switch branch with a harmonic cancellation (HC) block is depicted by a star on a solid curved line at a critical input power of 24 dBm. In this exemplary case, B17 is a relatively large TX output signal at 710 MHz. The undesirable H3 is at three times 710 MHz, which at 2100 MHz is in the B4 RX band. In other words, the TX output signal generates an undesirable H3 signal in B4. This undesirable H3 signal is then interpreted by the receiver, which is located on the same phone, as a received signal. The TX output signal is sent on the same antenna that is receiving the B4 signal. Thus, the undesirable H3 signal of B17 is jamming the B4 RX.

Figure 8:
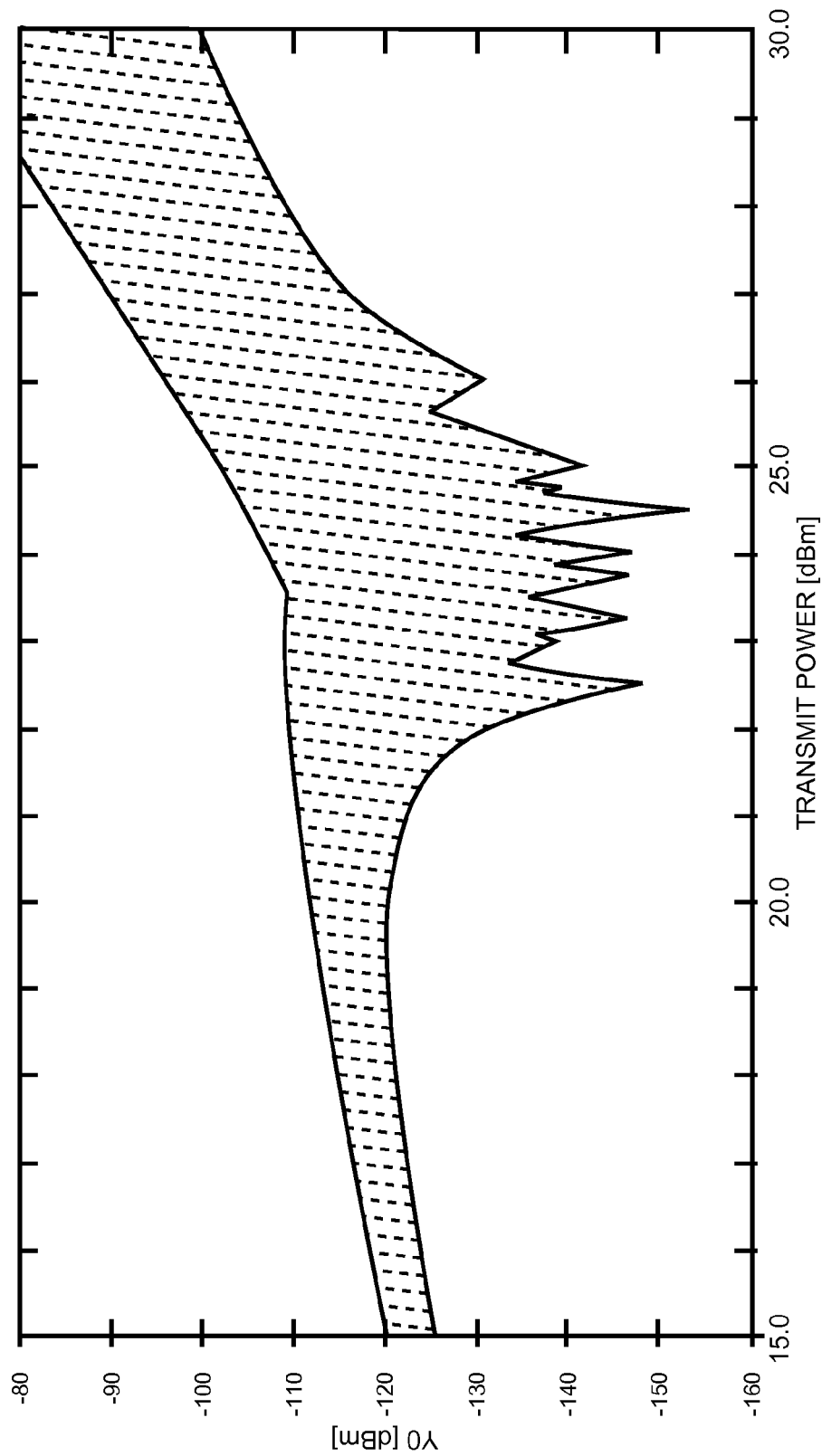
FIG. 8 is a graph showing the bounds of a one hundred run Monte Carlo simulation for process variation for harmonic cancellation according to the present disclosure.

FIG. 8 is a graph showing the bounds of a one hundred run Monte Carlo simulation for process variation for harmonic cancellation circuits taught in accordance with the present disclosure. Although there is a lot of variation, notches and reduced H3 signal levels are sufficient to reduce the H3 typical RF applications. Additionally, FIG. 8 shows that in simulation, process variations do not seriously degrade the performance of the harmonic cancellation circuits and blocks taught by the present disclosure.

Those skilled in the art will recognize improvements and modifications to the embodiments of the present disclosure. All such improvements and modifications are considered within the scope of the concepts disclosed herein and the claims that follow.

What is claimed is:
1. A harmonic cancellation circuit for a radio frequency (RF) switch branch comprising:
a first transistor having a first gate terminal and a first body terminal;

a second transistor having a second gate terminal coupled to the first body terminal and having a second body terminal coupled to the first gate terminal;

a first resistor coupled between a first coupling node and the second body terminal; and a second resistor coupled between a second coupling node and the first body terminal, wherein the first transistor and the second transistor are configured to generate an inverse phase third harmonic signal relative to a third harmonic signal generated by the RF switch branch, such that the inverse phase third harmonic signal is output through the first resistor and the second resistor to the RF switch branch to reduce the third harmonic signal.

2. The harmonic cancellation circuit for the RF switch branch of claim 1 further comprising a third resistor communicatively coupled between the first resistor and drain terminals of the first transistor and the second transistor, and a fourth resistor communicatively coupled between the second resistor and the drain terminals of the first transistor and the second transistor.

3. The harmonic cancellation circuit for the RF switch branch of claim 2 further comprising a fifth resistor coupled between the drain terminals of the first transistor and the second transistor.

4. The harmonic cancellation circuit for the RF switch branch of claim 3 wherein the fifth resistor has a variable resistance.

5. The harmonic cancellation circuit for the RF switch branch of claim 4 wherein the variable resistance of the fifth resistor is digitally controllable.

6. The harmonic cancellation circuit for the RF switch branch of claim 4 wherein the variable resistance of the fifth resistor is analog controllable.

7. The harmonic cancellation circuit for the RF switch branch of claim 1 further comprises a nonlinear capacitance from around about 1 fF/$V^2$ to around about 3 fF/$V^2$.

8. The harmonic cancellation circuit for the RF switch branch of claim 7 wherein a change of total capacitance for the first transistor and the second transistor ranges from around about 0.1% to around about 1%.

9. The harmonic cancellation circuit for the RF switch branch of claim 1 wherein the first gate terminal, the second gate terminal, the first body terminal, and the second body terminal are decoupled from source terminals and drain terminals of the first transistor and the second transistor.

10. The harmonic cancellation circuit for the RF switch branch of claim 1 wherein the first transistor and the second transistor are of a field effect transistor (FET) type.

11. An RF switch branch comprising:

a plurality of series coupled transistor switches having a first port and a second port; and a plurality of series coupled harmonic cancellation circuits communicatively coupled in parallel with at least some of the plurality of series coupled transistor switches, each of the plurality of series coupled harmonic cancellation circuits comprising:

a first transistor having a first gate terminal and a first body terminal;

a second transistor having a second gate terminal coupled to the first body terminal and having a second body terminal coupled to the first gate terminal;

a first resistor coupled between a first coupling node and the second body terminal; and a second resistor coupled between a second coupling node and the first body terminal, wherein the first transistor and the second transistor are configured to generate an inverse phase third harmonic signal relative to a third harmonic signal generated by the RF switch branch, such that the inverse phase third harmonic signal is output through the first resistor and the second resistor to the RF switch branch to reduce the third harmonic signal.

12. The RF switch branch of claim 11 further comprising a third resistor communicatively coupled between the first resistor and drain terminals of the first transistor and the second transistor, and a fourth resistor communicatively coupled between the second resistor and the drain terminals of the first transistor and the second transistor.

13. The RF switch branch of claim 12 further comprising a fifth resistor coupled between the drain terminals of the first transistor and the second transistor.

14. The RF switch branch of claim 13 wherein the fifth resistor has a variable resistance.

15. The RF switch branch of claim 14 wherein the variable resistance of the fifth resistor is digitally controllable.

16. The RF switch branch of claim 14 wherein the variable resistance of the fifth resistor is analog controllable.

17. The RF switch branch of claim 11 further comprises a nonlinear capacitance from around about 1 fF/$V^2$ to around about 3 fF/$V^2$.

18. The RF switch branch of claim 17 wherein a change of total capacitance for the first transistor and the second transistor ranges from around about 0.1% to around about 1%.

19. The RF switch branch of claim 11 wherein source terminals and drain terminals of the first transistor and the second transistor are coupled together.

20. The RF switch branch of claim 19 wherein the first gate terminal, the second gate terminal, the first body terminal, and the second body terminal are decoupled from the source terminals and the drain terminals.

21. The RF switch branch of claim 11 wherein the first transistor and the second transistor are of an FET type.

22. The RF switch branch of claim 11 wherein each of the plurality of series coupled harmonic cancellation circuits are coupled across a corresponding one of the plurality of series coupled transistor switches.

23. The RF switch branch of claim 11 wherein the plurality of series coupled harmonic cancellation circuits are coupled across only a portion of the plurality of series coupled transistor switches excluding ones of the plurality of series coupled transistor switches adjacent to the first port and the second port.

24. The RF switch branch of claim 11 further comprising degeneration resistors coupled between the plurality of series coupled harmonic cancellation circuits and the plurality of series coupled transistor switches.

* * * * *